United States Patent [19]

Downey et al.

[11] Patent Number: 4,902,631
[45] Date of Patent: Feb. 20, 1990

[54] MONITORING THE FABRICATION OF SEMICONDUCTOR DEVICES BY PHOTON INDUCED ELECTRON EMISSION

[75] Inventor: Stephen W. Downey, Chatham; Richard A. Gottscho, Maplewood, both of N.J.

[73] Assignee: AT&T Bell Laboratories, Murray Hill, N.J.

[21] Appl. No.: 264,240

[22] Filed: Oct. 28, 1988

[51] Int. Cl.⁴ .................... H01L 21/00; H01L 21/02; H01L 21/306; B44C 1/22

[52] U.S. Cl. ........................................ 437/7; 437/228; 437/7; 437/8; 437/225; 148/DIG. 51; 156/625; 156/626; 156/627

[58] Field of Search .................... 437/225, 228, 7, 8; 156/626, 627; 204/157.22, 192.12, 192.33; 148/DIG. 51, DIG. 93; 427/35, 36, 53.1, 74, 77

[56] References Cited

U.S. PATENT DOCUMENTS

| | | | |
|---|---|---|---|
| 4,298,443 | 11/1981 | Maydan | 204/192 |
| 4,358,338 | 11/1982 | Downey et al. | 204/192.33 |
| 4,383,885 | 5/1983 | Maydan | 156/643 |
| 4,554,047 | 11/1985 | Cook | 156/643 |
| 4,602,981 | 7/1986 | Chen et al. | 156/627 |
| 4,624,736 | 11/1986 | Gee et al. | 204/192.3 |
| 4,675,072 | 6/1987 | Bennet et al. | 204/192.33 |
| 4,687,539 | 8/1987 | Burns et al. | 204/192.32 |
| 4,713,140 | 12/1987 | Tien | 204/192.33 |

FOREIGN PATENT DOCUMENTS

| | | | |
|---|---|---|---|
| 0062169 | 5/1980 | Japan | 156/627 |
| 0171822 | 10/1983 | Japan | 156/627 |
| 0106976 | 6/1985 | Japan | 156/627 |

OTHER PUBLICATIONS

Bretscher, E., End-Point Detector for Dry-Etch Process, IBM Tech. Dis. Bull., vol. 24, No. 7B, Dec. 1981, pp. 3653-3654.
Downey, S., Photoemis Optogaloan. Spectro.: An /n Situ Metho. for Plasma Electrode Surface Characterization, J. Appl. Phys. 63(11), 6/1/88, pp. 5280-5287.
Journal of Applied Physics, 63, 5280 (1988).

Primary Examiner—Brian E. Hearn
Assistant Examiner—B. Everhart
Attorney, Agent, or Firm—Bruce S. Schneider

[57] ABSTRACT

Gas phase processes such as plasma etching of a semiconductor substrate is monitored by utilizing the optogalvanic effect. The substrate is subjected to light and in response emits an electron current whose magnitude is representative of the composition at the surface of the substrate. The monitored current is a sensitive indication of surface contamination and of compositional changes associated with the gas phase procedure. The technique is effectively utilized in fabricating devices such as semiconductor devices.

12 Claims, 2 Drawing Sheets

MONITORING THE FABRICATION OF SEMICONDUCTOR DEVICES BY PHOTON INDUCED ELECTRON EMISSION

BACKGROUND OF THE INVENTION

1. Field of the Invention

This invention relates to semiconductor device fabrication and, in particular, to semiconductor device fabrication involving plasma processing.

2. Art Background

During the fabrication of devices, typically a substrate is subjected to processing. For example, the substrate is subjected to a species generated in a plasma to induce removal of portions of the substrate surface layer. (In the context of this invention a substrate is a body being processed into optical or electronic device(s), e.g. semiconductor devices that includes regions of semiconductor material, dielectric material, and/or conductive material.) Alternatively, a plasma is employed to induce removal or deposition of material on a substrate through interaction of species generated in the plasma or through interaction between plasma generated species and a predominantly non-ionized gas.

Monitoring of the gas phase and surface processes are essential to device fabrication. In etch procedures, it is extremely important to determine when one material region has been removed to terminate the etch before destruction of underlying regions occurs. Similarly, in deposition procedures it is desirable to monitor the quality of the material being deposited.

A number of procedures are available at least for etch monitoring. For example, in an etching process the substrate is subjected to coherent radiation. Interference patterns generated by interaction of light reflected by the substrate upper surface and an interior substrate layer interface yield a measure of the time-dependent thickness of the region being etched. Alternatively, spontaneous or fluorescent emission induced by subjecting the plasma to coherent radiation is indicative of the material being etched from the substrate. When the fluorescence wavelength or intensity changes, a compositional change of the material being etched is signaled. If the uncovered material is not to be etched, the plasma procedure is then terminated.

Most plasma monitoring techniques rely on the optical detection of a signal induced by incident electromagnetic radiation. Although optical monitoring of plasma processes has proven to be extremely valuable, some improvement is still desirable. For some procedures, interference between light generated by the plasma and the optical signal presents detection difficulties. Optical techniques generally give no information about the surface composition. Optical procedures also generally require an optical path for incoming radiation and a second path for the signal being detected. This dual optical access is not always entirely convenient. Additionally, it is desirable to enhance detection sensitivity to the surface composition of the wafer.

SUMMARY OF THE INVENTION

A particularly sensitive electrical measurement of substrate surface composition is possible by utilizing the optogalvanic effect during the fabrication of devices such as semiconductor devices. During a device fabrication process, e.g. a plasma fabrication process, the substrate being treated is subjected to deep ultraviolet electromagnetic radiation. The interaction of absorbing materials with the radiation induces ejection of electrons that are easily detected at a suitable electrode in the vicinity of the substrate. The magnitude of the current detected is strongly dependent on the composition of the surface region. Thus, for example, if the exciting radiation is the 193 nm line from an excimer laser, a strong signal is detected when etching proceeds through a silicon dioxide layer to an underlying silicon region. Additionally, any contamination such as the presence of vacuum pump oil on the substrate surface induces a change of signal and allows termination of the procedure before irreparable degradation of the substrate occurs. Since the procedure is particularly sensitive to surface composition, even minor amounts of contamination are detectable. Other gas phase processes such as non-plasma techniques, e.g. chemical vapor deposition, are also advantageously monitored. The procedure is relatively simple and a second optical path for detecting the signal is not required. A sensitive, relatively simple technique for monitoring a plasma process is possible.

DETAILED DESCRIPTION

Figure 1:
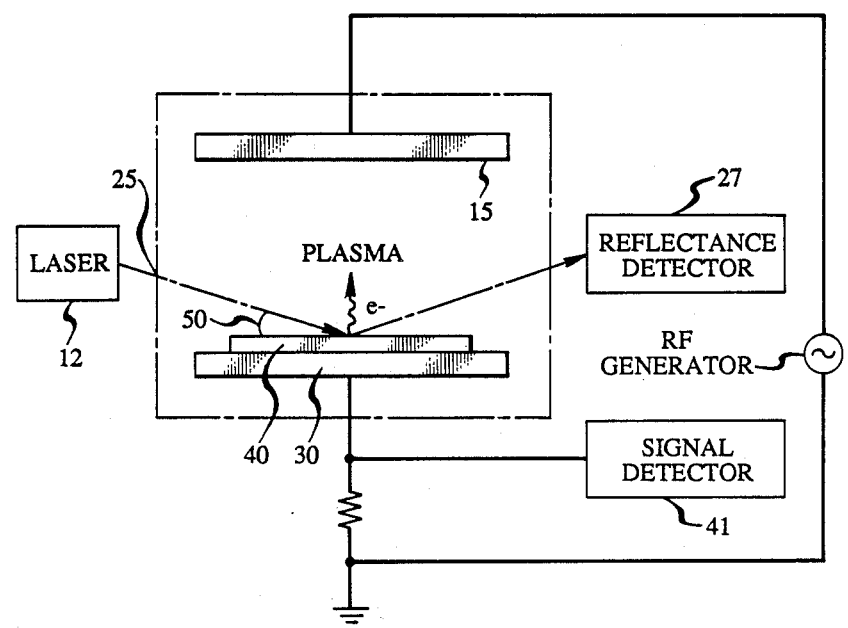
FIG. 1 is a schematic illustration of an apparatus suitable for practicing the invention.

The configuration of the fabrication equipment is not critical. Etchers such as hex etchers as described in U.S. Pat. No. 4,298,443 dated Nov. 3, 1981, parallel plate etchers such as described in U.S. Pat. No. 4,383,885 dated May 17, 1983, and downstream etchers such as described in U.S. Pat. NO. 4,554,047 dated Nov. 19, 1985, (all of which are hereby incorporated by reference) are useful. Typically in plasma processes, a powered electrode and an unpowered electrode are employed. (Power sources include dc and rf sources of energy.) Applied power frequency during an etching or deposition procedure is typically in the range from 0 to 14 MHz. The procedure does not depend on whether the substrate is placed on the powered or unpowered electrode.

Irrespective of etching electrode configuration and power application, an electrode should be present for detecting the signal to be monitored. An electrode, in addition to those utilized to produce the plasma, is not required if the substrate is proximate to the plasma. However, use of separate detection electrode is not precluded and, in fact, generally required for downstream etching or downstream deposition configurations. (Electrode in this context is broadly intended to include any conductive body for collecting electrons such as a metal portion of the apparatus, a sample holder or metallic shield.) Means should be provided to accelerate the generated electrons to a collection electrode. An external bias is useful for this purpose or in a plasma process it is possible to employ the source of discharge power. In a plasma procedure, electrons generated at the substrate by absorption of incident light are accelerated across the sheath of the discharge towards the opposing electrode during the positive portion of the rf cycle if the substrate is on the grounded electrode or during the negative portion of the rf cycle if the substrate is on the powered electrode. (If DC power is employed then the substrate should be on the grounded or negative electrode.) This acceleration is more than sufficient to insure that electrons are easily collected at the opposing electrode and detectable as a voltage drop across a suitable impedance. Thus, electrons should be generated during an appropriate portion of the rf cycle to induce acceleration to the opposing electrode. (The generation of all electrons does not have to occur during the appropriate portion of the bias cycle. For example, if a high rf frequency and a high laser pulse rate are employed, precise timing of electron generation with an appropriate accelerating bias is difficult. Nevertheless, sufficient coincidence of electrons and accelerating bias occurs even randomly to yield an easily detected signal.) For monitoring downstream processes or non-plasma processes, electron detection is conveniently effected by a biased electrode to accelerate the generated charges for collection. Generally, the electrode surface area for detection is not critical and even relatively small areas such as provided by a 0.25 mm (diameter) wire are useful.

The substrate is subjected to electromagnetic radiation chosen to be absorbed by at least some material present in the substrate surface region during at least a portion of the plasma fabrication procedure. (The surface region at any time is that region extending into the substrate a distance of 5 nm.) Incident electromagnetic radiation is also chosen to be sufficiently energetic to induce formation of free electrons. For typical semiconductor fabrication procedures, electromagnetic radiation with a wavelength shorter than 250 nm is generally suitable.

The signal observed depends, to an extent, on the exciting radiation. For example, in the fluorine plasma etching of silicon dioxide overlying a silicon region, the signal observed when etching of the silicon region begins, differs significantly with the wavelength of the exciting radiation. It is believed that a fluorine containing species is formed between the plasma entities and the exposed silicon. Electrons are produced from this fluorinated material by 193 nm radiation but not by 222 nm radiation. Thus, initial 222 nm radiation produces a characteristic strong signal which decays as the fluorine material is formed. However, the same procedure with 193 nm incident radiation, shows an onset when the silicon is reached with no subsequent decay. Because fluorine concentration varies with plasma conditions, the silicon etching signal observed with 222 nm incident radiation is not as reliable as that observed with 193 nm radiation. A control sample is easily utilized to determine a suitable exciting wavelength for the particular compositions and conditions utilized.

Typically, a pulsed light source such as a pulsed laser or a shuttered continuous source is employed. In this manner, the desired signal has an intensity variation with time corresponding to the exciting source. Thus, noise signals which do not have suitable time variation are easily removed through conventional techniques. However, if the process involves a non-downstream rf plasma the laser pulses should advantageously, as previously discussed, impact the substrate during a portion of the rf cycle that ensures efficient collection of emitted electrons. Typically, pulse rates in the range 10 Hz to 1 kHz are employed.

The power of the exciting source, and the impacted substrate area, in turn determines the level of the signal detected. Generally, the source should impact a substrate surface area of at least 1 cm$^2$. Although surface areas less than 1 cm$^2$ are not precluded, typically for such areas the signal substantially diminishes and is substantially more difficult to detect. Generally, surface area up to 10 cm$^2$ are irradiated, although it is possible to irradiate larger areas. Generally, total power applied to the substrate should be in the range 0.1 to 500 mJ/cm$^2$. Powers higher than 500 mJ/cm$^2$ tend to cause degradation of the substrate through processes such as laser ablation. Powers less than 0.1 mJ/cm$^2$, although not precluded, generally yield substantially degraded signal levels. Exemplary of a suitable signal level is a current of approximately 1 Amp generated in silicon by an impacting radiation power level of 0.5 mJ/cm$^2$ during etching of the silicon with a $NF_3$:Ar plasma.

It is generally desirable to use a non-polarized light source since some combinations of incident angle at the substrate with a polarized light yield reduced signal intensity. (Polarized sources are not precluded.) Typically, the light is introduced at an angle relative to the substrate of between 30° and 90°. (Higher angles for some apparatus configurations require a hole in the plasma electrode to provide a suitable optical path.) A control sample is employed to determine a suitable angle for a particular combination of substrate materials and light sources.

Although the described procedure involves an excellent means for monitoring the changes in surface composition during device fabrication procedures such as etching, the procedure is also extremely sensitive to surface composition changes in procedures generally employing gas phase interactions with a substrate. For example, the presence of a surface contaminant such as the presence of vacuum pump oil is detectable by monitoring the generated photocurrent. In a typical application, a prototypical current variation with time is determined for the device fabrication procedure to be utilized. During fabrication the photocurrent detected is compared with the prototypical determination. Variations between the prototype and the signal being detected indicates a deviation from the desired process and allows termination or correction of the procedure before unacceptable degradation occurs. Thus, for example, presence of contamination in an etching procedure or the production of an undesired deposit during a deposition or removal procedure is detectable by comparing time variation in photocurrent being monitored to a prototype. Alternatively, a change in detected current indicates a corresponding composition change in the material layer being etched and indicates the time for termination of the etching procedure. Such endpoint detection is relatively sensitive and is typically accurate to better than 150 Å, indeed as good as 50 Å.

The following examples are illustrative of conditions suitable for practicing the invention.

EXAMPLE 1

The plasma etching apparatus employed was essentially that described in the *Journal of Applied Physics*, 63, 5287 (1988). This apparatus was modified to include a laser suitable for inducing production of photoelectrons and a system for collecting these photoelectrons. As shown in FIG. 1, the laser, 12, was an excimer laser (222 nm). The laser was pulsed at a repetition rate of 40 Hz with a pulse energy of 5 mJ. The laser power was directed into the reactor with two turning prisms and a mirror. The light was focused with a 2 m focal length lens to a surface area at the substrate of approximately 10 cm$^2$ with a power density of 10$^5$ W/cm$^2$.

The electrodes utilized were either formed of aluminum or stainless steel and were approximately 7.6 cm in diameter. The electrodes were spaced approximately 3.9 cm apart. The top electrode (15 in FIG. 1) was connected to the rf power supply and the electrode 30 that held the sample 40, was grounded through a 50 Ohm impedance. The rf generator operated at a frequency between 0.05 and 10 MHz. (The result obtained did not particularly depend on the rf frequency utilized.) The electrodes were placed at the intersection of 3 mutually perpendicular rectangular glass tubes. The entrance window was provided into the chamber as shown at 25 in FIG. 1. Light from the laser was made incident through this window on the substrate at an angle, 50, of approximately 63° relative to the substrate. Reflected light was detected at 27 through a second window. Spacing between the rf source and the pulsing of lasers was controlled utilizing a pulse generator. The laser was fired when the rf voltage was at its positive peak relative to the grounded electrode. The signal was processed at 41 using an oscilloscope and a gated integrator to suppress the normal current from the discharge. This subtraction was provided by short circuiting the signal after sampling by the gate integrator. The cable length was chosen such that the inverted voltage from the reflected signal at the short circuit canceled the plasma background. The gate width of the integrator was approximately 10 nanoseconds which was the width of the laser pulse. Eight laser pulses were averaged through each data point. Two photodetectors were employed to measure the incident and reflected power of the laser. The output from these photodiodes were processes as described for the photoemission signal being detected.

Figure 2:
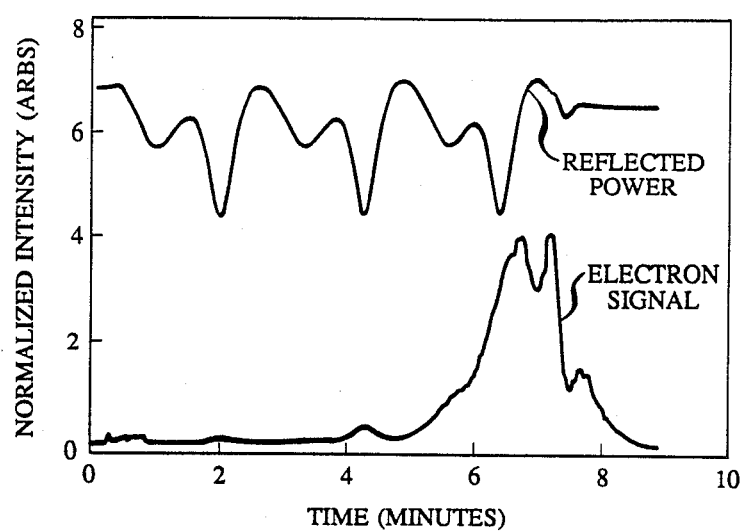
FIGS. 2 and 3 are illustrative of process parameters.

A three inch in diameter wafer of silicon was employed with its major surface in the (100) crystallographic plane and with a 300 nm thick silicon dioxide layer grown by thermal oxidation or chemical vapor deposition. The plasma reactor was opened to the ambient and the wafer placed on the lower (grounded) electrode. The chamber was purged with dry nitrogen to reduce the presence of water vapor. The purged gas was then terminated and the reactor sealed and evacuated to a pressure of approximately $1 \times 10^{-7}$ Torr. An etchant gas consisting of a 4 to 1 mixture of $CF_4$ and $O_2$ was introduced into the chamber at a flow rate of 10 sccm. The pump rate was such that a total pressure of approximately 0.3 Torr was obtained. The plasma was ignited by applying an rf power to the electrodes of approximately 10 to 30 Watts yielding a power density of approximately 0.15 W/cm$^3$. The current induced by production of electrons at the substrate by the laser (222 nm) was monitored as described above. The signal obtained (as well as the reflected power signal) as a function of time during the etching procedure is shown in FIG. 2. As can be seen the current increased at approximately 7 minutes when the silicon was reached and then tapered off.

EXAMPLE 2

Figure 3:
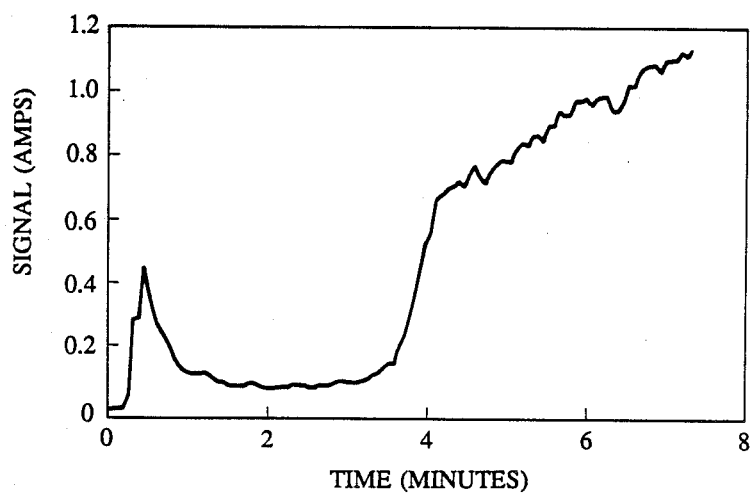

The procedure of Example 1 was followed except as unfocused 193 nm ArF laser was employed with a pulse energy of 23 mJ. The gas introduced was one part $NF_3$ to 9 parts of Ar. The total gas flow was approximately 40 sccm and the plasma power employed was 26 Watts. The obtained current signal is shown in FIG. 3. As can been seen the silicon dioxide was cleaned from the silicon substrate after approximately 4 minutes.

What is claimed is:

1. A process for fabricating a device comprising the steps of subjecting a substrate to a gas phase species to induce a change in said substrate and employing said changed substrate to effect said fabrication characterized in that during said change, said substrate is subjected to non-particle electromagnetic radiation that induces formation of free electrons in said substrate, said electrons are monitored and said change is either terminated, adjusted, or allowed to continue based on said monitoring wherein said change is induced by a source other than said non-particle electromagnetic radiation.

2. The process of claim 1 wherein said change comprises etching of at least a portion of said substrate.

3. The process of claim 2 wherein said species is generated in a plasma.

4. The process of claim 3 wherein said substrate is subjected to said species at a position removed from said plasma.

5. The process of claim 1 wherein said species is generated in a plasma.

6. The process of claim 1 wherein said change comprises a deposition of a material onto said substrate.

7. The process of claim 6 wherein said species is generated in a plasma.

8. The process of claim 7 wherein said substrate is subjected to said species at a position removed from said plasma.

9. The process of claim 1 wherein said monitoring comprises determining the change in current with time due to said electrons.

10. The process of claim 9 wherein said termination is instituted due to a deviation of said current from a prototypical level.

11. The process of claim 9 wherein said termination is instituted when a change in composition of said substrate surface is indicated.

12. The process of claim 11 wherein said change in composition is due to etching.

* * * * *